United States Patent
Basu et al.

(10) Patent No.: US 12,001,358 B2
(45) Date of Patent: *Jun. 4, 2024

(54) STATUS CHECK USING SIGNALING FROM A MEMORY DEVICE

(71) Applicant: Micron Technology, Inc., Boise, ID (US)

(72) Inventors: Reshmi Basu, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/114,617

(22) Filed: Feb. 27, 2023

(65) Prior Publication Data

US 2023/0281140 A1 Sep. 7, 2023

Related U.S. Application Data

(63) Continuation of application No. 17/105,053, filed on Nov. 25, 2020, now Pat. No. 11,599,485.

(51) Int. Cl.
*G06F 13/16* (2006.01)
*G06F 1/12* (2006.01)

(52) U.S. Cl.
CPC ............ *G06F 13/1689* (2013.01); *G06F 1/12* (2013.01)

(58) Field of Classification Search
CPC .... G06F 13/1689; G06F 13/1694; G06F 1/04; G06F 1/10; G06F 1/12; G06F 1/14
See application file for complete search history.

(56) References Cited

U.S. PATENT DOCUMENTS

| | | | |
|---|---|---|---|
| 8,966,208 B2 * | 2/2015 | Gillingham | G06F 13/1689 711/167 |
| 11,599,485 B2 * | 3/2023 | Basu | G11C 7/1063 |
| 2015/0187399 A1 | 7/2015 | Tuers et al. | |
| 2015/0363342 A1 | 12/2015 | Tuers et al. | |
| 2017/0212709 A1 | 7/2017 | Oh | |
| 2019/0051336 A1 | 2/2019 | Kim et al. | |
| 2019/0101945 A1 | 4/2019 | Marquette et al. | |
| 2020/0393965 A1 | 12/2020 | Xiao et al. | |
| 2021/0181985 A1 | 6/2021 | Shin | |
| 2021/0255796 A1 | 8/2021 | Takano | |
| 2022/0011959 A1 | 1/2022 | Srinivasan et al. | |

* cited by examiner

*Primary Examiner* — Raymond N Phan
(74) *Attorney, Agent, or Firm* — Holland & Hart LLP

(57) ABSTRACT

Methods, systems, and devices for status check using signaling are described. A memory system may receive ready signals from memory dies. The ready signal may indicate whether a memory die is available to receive a command. The memory system may generate an indicator of whether the memory die is available based on values of ready signals. The memory system may output the indicator to a controller over one or more pins based on generating the indicator.

20 Claims, 6 Drawing Sheets

STATUS CHECK USING SIGNALING FROM A MEMORY DEVICE

CROSS REFERENCE

The present Application for Patent is a continuation of U.S. patent application Ser. No. 17/105,053 by Basu et al., entitled "STATUS CHECK USING SIGNALING," filed Nov. 25, 2020, assigned to the assignee hereof, and is expressly incorporated by reference in its entirety herein.

FIELD OF TECHNOLOGY

The following relates generally to one or more systems for memory and more specifically to status check using signaling.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
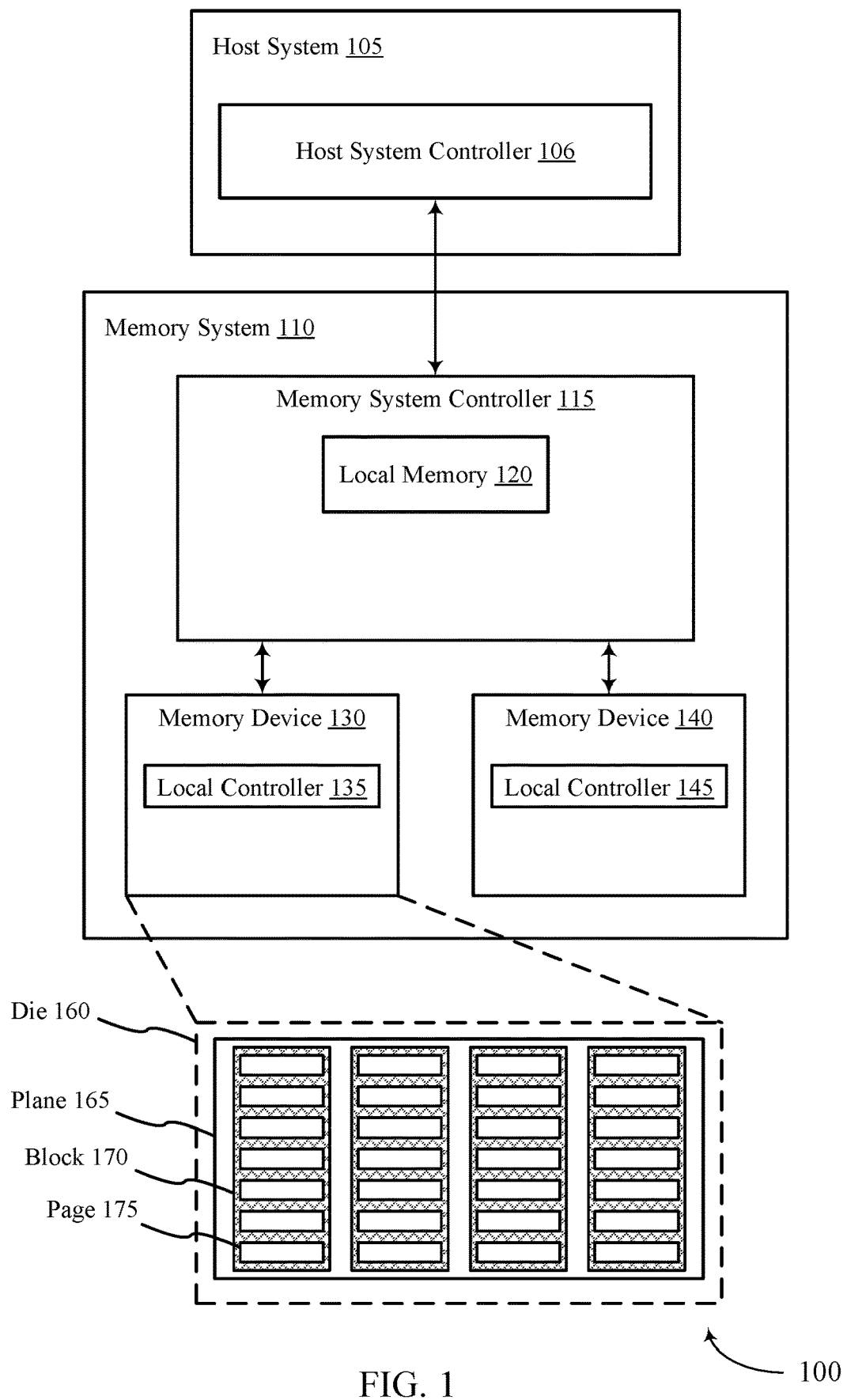
FIG. 1 illustrates an example of a system that supports status check using signaling in accordance with examples as disclosed herein.

Some memory systems perform a status check by status register polling. During the status register polling, the controller may poll the memory system (e.g., sending a request) to determine which memory dies are ready to receive a command. In some cases, the polling requests and responses may be communicated over one or more open NAND flash interface (ONFI) channels. Such procedures may result in an increased command overhead and decrease in channel bandwidth availability. As the quantity of memory dies increase within the memory system, the status checks may become an increasing hindrance to the efficiency of the ONFI channel.

Such techniques may result in the memory system experiencing decreased channel utilization efficiency and a performance loss when performing memory device operations, which may increase the latency for other operations related to the memory system. By performing independent status checks for memory dies, the memory system may use an increased amount of power, thereby decreasing the overall performance of the memory system. Techniques to manage status checks without compromising channel bandwidth and memory device performance are described.

Aspects of the present disclosure address the above and other deficiencies by having a memory system that reports the ready status of memory dies using signaling. The memory device may send an indication to the controller that the memory device is ready to receive commands, rather than the controller sending requests across the ONFI channels. For example, the memory system may include an output circuit that is configured to receive a ready signal from each of the memory dies. The ready signal may indicate whether a memory die is available to receive the command. In such cases, the output circuit may generate an indictor based on a value of the received ready signal and output the indicator to the controller via a pin. In some examples, the memory system may use general input/output (GPIO) pins to inform the controller of the status.

By using dedicated pins and encoding the pins to communicate ready status rather than using DQ pins (e.g., ONFI channels), the overall performance of the memory system for performing host commands may increase. For example, reporting the ready status using dedicated pins may improve the overall efficiency of the memory system, which may result in the system experiencing reduced latency between transmitting commands to different memory dies, improved read, write, and erase speeds, improved processing times, and the like.

Features of the disclosure are initially described in the context of systems and dies as described with reference to FIG. 1. Features of the disclosure are described in the context systems and encoders as described with reference to FIGS. 2-4. These and other features of the disclosure are further illustrated by and described with reference to an apparatus diagram and a flowchart that relate to status check using signaling as described with reference to FIGS. 5-6.

FIG. 1 illustrates an example of a system 100 that supports status check using signaling in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, the memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). The memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support status check using signaling. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140

(e.g., by a local controller 145), may cause the host system 105, memory system controller 115, memory device 130, or memory device 140 to perform associated functions as described herein.

The memory device 130 may include a plurality of memory dies (e.g., die 160) and each memory die is configured to output a ready signal. The ready signal may indicate whether the memory die is available to receive and/or execute a command from a host system. The memory device 130 may also include an output circuit. The output circuit may be coupled with each memory die and configured to receive the ready signal. In some cases, the output circuit may generate an indicator based on a value of the ready signal. In some examples, the memory device 130 may include a pin that is coupled between the output circuit and a controller (e.g., memory system controller 115). The pin may be configured to output the indicator to the controller over an I/O channel.

Figure 2:
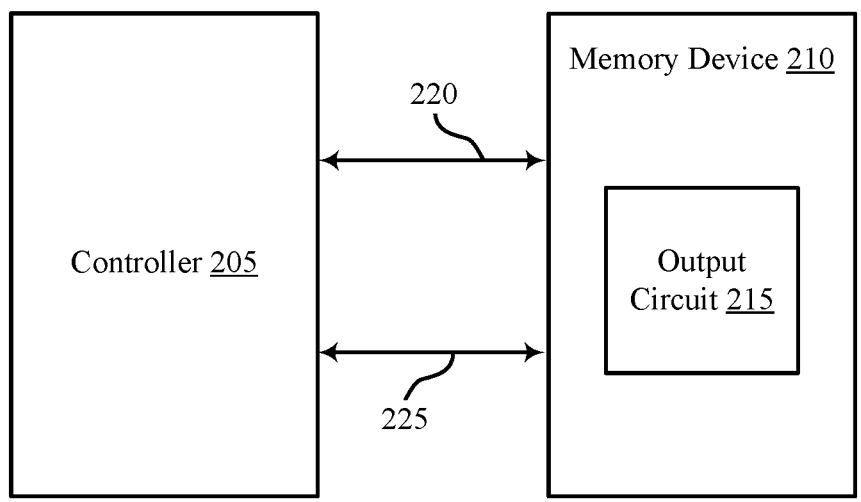
FIG. 2 illustrates an example of a system that supports status check using signaling in accordance with examples as disclosed herein.

FIG. 2 illustrates an example of a system 200 that supports status check using signaling in accordance with examples as disclosed herein. The system 200 may include a controller 205 and a memory device 210. The memory device 210 may include an output circuit 215. In some cases, the controller 205 and the memory device 210 may be coupled via a first set of channels 220 and a second set of channels 225. The controller 205 and memory device 210 may each be an example of aspects of a host system controller 106, a memory system controller 115 or both as described with reference to FIG. 1.

The memory device 210 may include memory dies. Each memory die may be configured to receive commands from a host system and perform those commands. After the command is performed or at some point during the process of executing a command, the memory die may be ready to receive and execute another command. Each may die may be configured to output a ready signal that indicates whether the memory die is available to receive a command. In some cases, the memory device 210 may include the output circuit 215. The output circuit 215 may be configured to receive the ready signal from the memory die and generate an indicator of whether the memory die is available. The indicator may be based on a value of the ready signal. In some examples, the output circuit 215 may be an example of an encoder or a shift register.

The first set of channels 220 may be coupled with the memory device 210 and the controller 205. In some cases, the first set of channels 220 may be an example of non-ONFI channels or general-purpose input/output (GPIO) channels. The first set of channels may be coupled with a first pin configured to output the indicator to the controller 205 over the first set of channels 220 (e.g., first input/output (I/O) channel). The first pin may be coupled with the output circuit 215 of the memory device 210. For example, the first pin may be an example of a GPIO pin.

In some cases, the first set of channels 220 may be used to communicate with the controller 205. For example, the memory device 210 may communicate information to the controller 205 by transmitting a signal over the first set of channels 220. In some cases, the signals transmitted over the first set of channels 200 may interrupt the operations of the controller 205. In such cases, the first set of channels 220 may be an example of an interrupter of the controller 205. The first set of channels 220 may transmit a single bit per memory die of the memory device 210 that indicates whether the memory device is ready to receive commands.

In memory systems where polling is used to determine a ready status of a memory die, there may be a delay between when a memory die is ready and when the controller 205 finally identifies that the memory die is ready to receive another command. Using the first set of pins (instead of status polling) to communicate the ready status of memory dies may decrease the latency between when a memory die becomes ready and when the controller 205 identifies that the memory die is ready. In such cases, the memory device 210 may perform an increased amount of parallel operations (e.g., increase parallelism) because the host system may be enabled to direct commands to memory dies that are ready sooner than using status polling techniques.

The second set of channels 225 may be coupled with the memory device 210 and the controller 205. In some case, the second set channels 225 may be an example of ONFI channels. The second set of channels 225 may communicate information at a speed higher than a speed that information is communicated via the first set of channels 220. For example, the second set of channels 225 may increase a compatibility of communication between memory devices 210 by communicating information at a higher frequency as compared to the first set of channels 220. In some examples, the second set of channels 225 may use increased amounts of power as compared to the first set of channels 220. The resources of the memory device 210 may be in higher demand for other information when using the second set of channels 225 to communicate information. In such cases, the second set of channels 225 may experience inefficiencies in the memory device 210 operations. In some cases, the second set of channels 225 may not transmit information regarding the ready signal. The increased speed of the second set of channels 225 (e.g., the ONFI channels) may be used to communicate data between the memory system and the host system and thereby improve the performance of the memory system. Thus, using such ONFI resources for status polling may reduce an amount of data that can be transferred between the host system and the memory system.

Instead of the controller 205 transmitting, via the second set of channels 225, multiple requests to each memory die of the memory device 210, the memory device 210 may send an indication to the controller 205 that the memory device 210 is ready to receive commands. The memory device 210 may send the indication to the controller 205 via the first set of channels 220. The memory device 210 may send the indication via a dedicated pin (e.g., the first pin) coupled with the first set of channels 220 such that the data may be compressed, thereby reducing the signaling overhead and improving the overall operation of the memory device 210. In such cases, the direct connection between the memory device 210 and the controller 205 may increase processing times and decrease the latency. In some cases, the first set of pins used to communicate the ready signals may be pins that may not be used in other contexts or may have a use that is not active during a normal mode of operation of the memory system.

Figure 3:
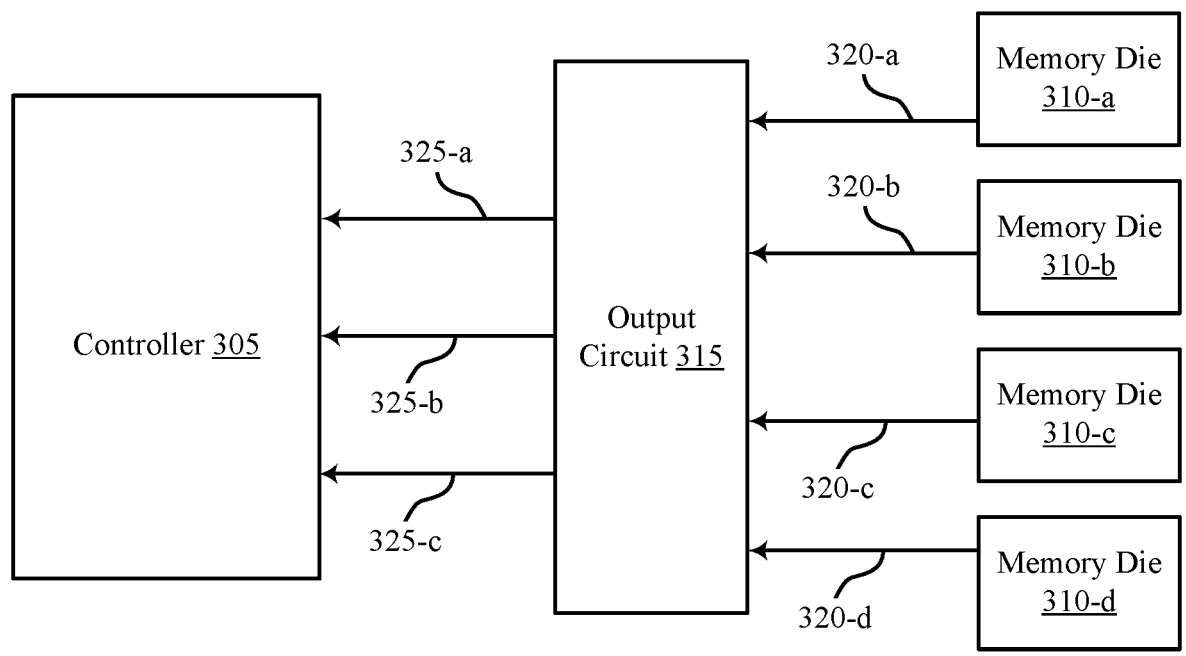
FIG. 3 illustrates an example of a system including an encoder that supports status check using signaling in accordance with examples as disclosed herein.

FIG. 3 illustrates an example of a system 300 including an encoder that supports status check using signaling in accordance with examples as disclosed herein. The system 300 may include a controller 305, memory dies 310, and an output circuit 315. The controller 305 and output circuit 315 may be each be an example of aspects of the controller 205 and output circuit 215, respectively, as described with reference to FIG. 2.

The system 300 may include one or more memory dies 310 (e.g., memory dies 310-*a*, 310-*b*, 310-*c*, and 310-*d*). The memory dies 310 may be included in the memory device. Each memory die 310 may be coupled with the output circuit 315 via a channel 320.

For example, the memory die 310-*a* may be coupled with the output circuit 315 via channel 320-*a*, the memory die 310-*b* may be coupled with the output circuit 315 via channel 320-*b*, the memory die 310-*c* may be coupled with the output circuit 315 via channel 320-*c*, and the memory die 310-*d* may be coupled with the output circuit 315 via channel 320-*d*.

The output circuit 315 may be an example of an encoder that receives inputs from the one or more memory dies 310 and encodes an output to send to the controller 305. The output may include an address of the memory die that is ready and/or a signal that indicates that the address being output by the output circuit 315 is valid and should be read by the controller 305. In some cases, the output circuit 315 may include a buffer if more than one memory die becomes ready before the addresses can be output to the controller 305.

In some case, each memory die 310 may be configured to output a ready signal that indicates whether the memory die 310 is available to receive a command. For example, the memory die 310-*a* may output a ready signal that indicates that the memory die 310-*a* is available to receive a command. In some examples, the memory dies 310-*b*, 310-*c*, and 310-*d* may each output a ready signal that indicates that each of memory dies 310-*b*, 310-*c*, and 310-*d* are unavailable. In some cases, each memory die 310 may output a ready signal that indicates that every memory die 310-*a*, 310-*b*, 310-*c*, and 310-*d* are ready to receive a command. In such cases, each ready signal may be associated with a time stamp. The time stamp may indicate an order that the memory dies 310 may receive the command in response to the transmitted ready signal. For example, if memory die 310-*a* output ready signal before memory die 310-*b*, then memory die 310-*a* may receive the command before memory die 310-*b*.

The output circuit 315 may be configured to receive each ready signal associated with each of the memory dies 310-*a*, 310-*b*, 310-*c*, and 310-*d*. Based on a value of the ready signal, the output circuit 315 may generate an indicator. The indicator may include two portions. The first portion of the indicator and a second portion of the indicator may be configured to identify the memory die 310 that is available. For example, the first portion of the indicator may identify the memory die 310 that is ready to receive a command. In some cases, the first portion of the indicator may indicate an index or address of the memory die 310 that is available. In some examples, the first portion of the indicator may include more than one bit. For example, a quantity of bits included in the first portion of the indicator may be based on a quantity of memory dies 310 that provide inputs to the output circuit 315. For example, if four memory dies provide inputs to the output circuit 315, the first portion may be two bits to thereby uniquely identify each memory die that may be ready.

The second portion of the indicator may indicate that the output circuit 315 is outputting information related to the ready signals transmitted by the memory dies 310. For example, the second portion of the indicator may indicate that the first portion of the indicator is ready and/or output to the controller 305. In some examples, the second portion of the indicator may be an example of an activate signal.

The output circuit 315 may be coupled with the controller 305 via pins 325. For example, the system 300 may include pins 325-*a*, 325-*b*, and 325-*c*. The quantity of pins 325 may be based on the quantity of memory dies that are coupled with the output circuit 315. For example, if the system 300 may include four memory dies (e.g., memory dies 310-*a*, 310-*b*, 310-*c*, and 310-*d*), then the system 300 may include three pins 325 (e.g., pins 325-*a*, 325-*b*, and 325-*c*).

The pin 325-*a* (e.g., a first pin) and the pin 325-*b* (e.g., a second pin) may be coupled with the output circuit 315 and configured to output a portion (e.g., the first portion) of the indicator to the controller 305 over a first I/O channel and a second I/O channel, respectively. The pin 325-*a* and pin 325-*b* may be configured to output first portion of the indicator as identified in TABLE 1.

TABLE 1

| Die 310-a Ready Signal | Die 310-b Ready Signal | Die 310-c Ready Signal | Die 310-d Ready Signal | First Portion output via Pin 325-a | First Portion output via Pin 325-b |
|---|---|---|---|---|---|
| 1 | 0 | 0 | 0 | 0 | 0 |
| 0 | 1 | 0 | 0 | 0 | 1 |
| 0 | 0 | 1 | 0 | 1 | 0 |
| 0 | 0 | 0 | 1 | 1 | 1 |

The memory device may output a first portion of the indicator over the pins 325-*a* and 325-*b* where the first portion of the indicator identifies the memory die 310 that is available. For example, the memory die 310-*a* may output a ready signal that indicates that the memory die 310-*a* is ready to receive a command. In such cases, the value of the ready signal received at an input of the output circuit 315 may be a first value (e.g., "1"). The output circuit 315 may generate an address for the memory die that is ready, (e.g., 00) and output that address over pins 325-*a* and 325-*b*. When a valid address is being output over the pins 325-*a* and 325-*b*, the output circuit 315 may also output a signal over pin 325-*c* indicating that the controller 305 should read the output of pins 325-*a* and 325-*b*. In such cases, the first portion of the indicator (e.g., "00" combination) may be configured to identify that memory die 310-*a* is available.

In other examples, the memory die 310-*b* may output a ready signal that indicates that the memory die 310-*b* is ready to receive a command. In such cases, the output circuit 315 may generate an address of the ready memory die (e.g., 01 as shown in Table 1) and output the address over the pins 325-*a* and 325-*b* as the first portion. When a valid address is being output over the pins 325-*a* and 325-*b*, the output circuit 315 may also output a signal over pin 325-*c* indicating that the controller 305 should read the output of pins 325-*a* and 325-*b*. In such cases, the first portion of the indicator (e.g., "01" combination) may be configured to identify that memory die 310-*b* is available.

The memory die 310-*c* may output a ready signal that indicates that the memory die 310-*c* is ready to receive a command. In such cases, the output circuit 315 may generate an address of the ready memory die (e.g., 10 as shown in Table 1) and output the address over the pins 325-*a* and 325-*b* as the first portion. When a valid address is being output over the pins 325-*a* and 325-*b*, the output circuit 315 may also output a signal over pin 325-*c* indicating that the controller 305 should read the output of pins 325-*a* and 325-*b*. In such cases, the first portion of the indicator (e.g., "10" combination) may be configured to identify that memory die 310-*c* is available.

In some cases, the memory die 310-*d* may output a ready signal that indicates that the memory die 310-*c* is ready to receive a command. In such cases, the output circuit 315 may generate an address of the ready memory die (e.g., 11 as shown in Table 1) and output the address over the pins 325-*a* and 325-*b* as the first portion. When a valid address is being output over the pins 325-*a* and 325-*b*, the output circuit 315 may also output a signal over pin 325-*c* indicating that the controller 305 should read the output of pins 325-*a* and 325-*b*. In such cases, the first portion of the indicator (e.g., "11" combination) may be configured to identify that memory die 310-*d* is available.

In some examples, memory device may include pin 325-*c* (e.g., a third pin) that may be coupled with the output circuit 315 and configured to output a second portion of the indicator. In some cases, the second portion of the indicator may be referred to as a second indicator to the controller 305. The second portion may be configured to indicate whether the controller 305 is to read the indicator. For instance, values for the first portion may be continuously output on the respective pins. However, in some cases, the information may not be valid. The second portion may be used to indicate to the controller 305 when the controller 305 is to treat the output of the first portion as valid information (e.g., a valid address). For example, if the value of the pin 325-*c* is a first value, the second portion may indicate, to the controller 305, to read the first portion (e.g., output via pins 325-*a* and 325-*b*). If the value of the pin 325-*c* is a second value, the second portion may indicate, to the controller 305, to ignore (e.g., not read) the first portion (e.g., output via pins 325-*a* and 325-*b*). In some examples, pins 325-*a*, 325-*b*, and 325-*c* may each be an examples of a GPIO pin.

The output circuit 315 may be an example of an encoder. For example, the output circuit 315 includes an encoder configured to receive the ready signals and generate the indicator based on the ready signals. Use of the encoder may reduce the quantity of pins used to communicate ready signals rather than having a dedicated ready signal pin for each memory die. For example, Rather than the controller 305 continuously reading the ready signals from each memory die 310, the output circuit 315 may generate an indicator to notify the controller 305 when a memory die 310 is available and which memory die 310 is available. Use of the GPIO pins may reduce the load on ONFI channels. Use of the encoder may reduce the total quantity of GPIO pins used to communicate the ready signals. By using dedicated pins and encoding the pins to communicate a ready status to the controller 305, the system 300 may effectively manage status checks without compromising channel bandwidth (e.g., ONFI channel bandwidth) and memory device performance. In such cases, the output circuit 315 may manage the command queue instead of the controller 305, and the pins 325-*a*, 325-*b*, and 325-*c* may be dedicated (e.g., used) for the status checks.

In other systems, the memory device may be unable to interrupt the operations of the controller 305 and may communicate with the controller 305 after the operations are complete. In such cases, the memory device may experience increased latency, decreased read, write, and erase speeds, and decreased processing times. In some cases, the controller 305 may check the status of each memory die, thereby increasing the overhead, latency, and inefficiency of the memory system. By encoding the status of each memory die 310, the memory device may operate with increased flexibility and efficiency by increasing a quantity of encoded data. In some cases, the voltage levels of each pin 325 may be adjusted to increase the efficiency of the memory device operations.

Figure 4:
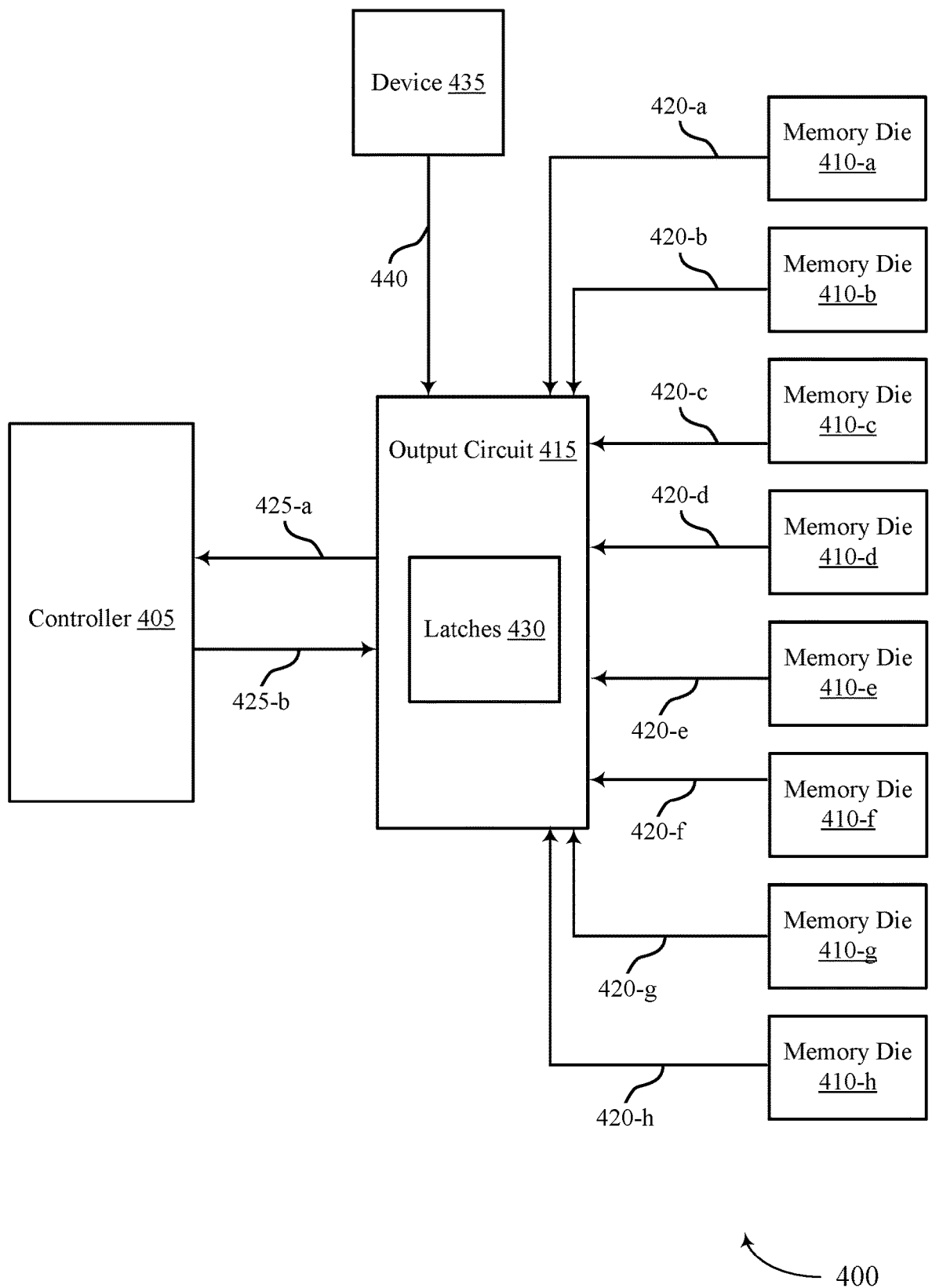
FIG. 4 illustrates an example of a system including a shift register that supports status check using signaling in accordance with examples as disclosed herein.

FIG. 4 illustrates an example of a system 400 including a shift register that supports status check using signaling in accordance with examples as disclosed herein. The system 400 may include a controller 405, memory dies 410, and an output circuit 415. The controller 405, memory dies 410, and output circuit 415 may be each be an example of aspects of the controller, memory dies, and output circuit, respectively, as described with reference to FIG. 2.

The system 400 may include memory dies 410 (e.g., memory dies 410-*a*, 410-*b*, 410-*c*, 410-*d*, 410-*e*, 410-*f*, 410-*g*, and 410-*h*). The memory dies 410 may be included in the memory device. Each memory die 410 may be coupled with the output circuit 415 via a channel 420. For example, the memory die 410-*a* may be coupled with the output circuit 415 via channel 420-*a*. In some case, each memory die 410 may be configured to output a ready signal that indicates whether the memory die 410 is available to receive a command. For example, the memory die 410-*a* may output a ready signal that indicates that the memory die 410-*a* is ready to receive a command. In other examples, the memory die 410-*a* may output a ready signal that indicates that the memory die 410-*a* is unavailable.

The output circuit 415 may be an example of a shift register that receives inputs from the one or more memory dies 410 and outputs information for each memory die in a rotating manner. The output may include a bit that indicates whether a particular memory die is ready. The shift register may output a signal for a memory die at every clock cycle. The shift register what memory die is being indicating such that shift register is continually cycling through the signals for different memory dies. The controller 405 may identify which memory die ready signal is being output by the shift register based on an initialization operation for the shift register.

The output circuit 415 may be configured to receive ready signals associated with each of the memory dies 410. Based on a value of the ready signal, the output circuit 415 may generate an indicator. The indicator may be configured to indicate whether a memory die 410 is available. In some examples, the output circuit 415 may be an example of a shift register. The output circuit 415 (e.g., shift register) may store the ready signals and output the indicator via pin 425 over a first I/O channel. The output circuit 415 may output data in a serial manner. For example, the output circuit 415 may latch input (e.g., a ready signal) from each memory die 410 and output data (e.g., the indicator) for each memory die 410. The output circuit 415 may cycle through each latch 430 associated with each corresponding memory die 410. For example, the output of pin 425-*a* may be an indicator of a single memory die 410. In such cases, the controller 405 and output circuit 415 may be aligned to determine which memory die 410 data is outputted.

The output circuit 415 may be configured to output the indicator to the controller 405 based on a clock signal. For example, the system 400 may include a pin 425-*b* (e.g., a second pin) that may be configured to receive a clock signal over a second I/O channel. The pin 425-*b* may be configured to synchronize the output of the indicator to the controller 405 at a clock rate associated with the controller 405. In some cases, the output circuit 415 may output information, but the controller 405 may not be able to identify which memory die 410 transmitted the information. In such cases, the clock signal may coordinate the controller 405 and the output circuit 415 such that a clock cycle may correspond to each memory die 410. For example, the first clock cycle may correspond to the memory die 410-*a*, and the second clock cycle may correspond to the memory die 410-*b*. The memory device may receive, from the controller 405, the clock signal configured to synchronize the output circuit 415 where the output circuit 415 outputs the indicator at a clock rate. In such cases, the output circuit 415 may output the indicator at same frequency (e.g., clock rate) that the controller 405 may be able to read the indicator. In some examples, the output circuit 415 may output the indicator based on receiving the clock signal. The pin 425-*a* and 425-*b* may each be an example of a GPIO pin. In some examples, the pin 425-*a* may include additional information based on a frequency or voltage of the ready signal. In some cases, the data in the shift register is shifted to different latches when the clock signal is received.

In cases, the output circuit 415 may include a plurality of latches 430. The plurality of latches 430 may each be configured to store a value of the ready signals associated with the memory dies 410. In such cases, each memory die 410 may be associated with a corresponding latch 430. For example, a first latch 430 may store a value of the ready signal associated with memory die 410-*a* and a second latch 430 may store a value of the ready signal associated with the memory die 410-*b*. The memory device may store the ready signals associated with each memory die 410 based on receiving the ready signals. In some examples, the output circuit 415 may generate the indicator based on storing the ready signals.

The output circuit 415 may be configured to receive an enable signal over channel 440 and output the indicator to the controller 405 based on receiving the enable signal. The enable signal may be an example of a status read command. In some cases, a device 435 may transmit the enable signal, via channel 440, to the output circuit 415. The device 435 may be an example of a device external to the memory device or a device internal to the memory device. In some examples, the enable signal may be configured to activate the output circuit 415 to output the indicator to the controller 405 based on receiving the enable signal.

The output circuit 415 may output the indicator, and the controller 405 may read the indicator simultaneously and sequentially for each memory die 410. In such cases, the output circuit 415 (e.g., including the shift register) may operate at increased speeds and efficiency. In some examples, the output circuit 415 may operate at increased speeds due to the reduction in the quantity of pins 425 as compared to the quantity of pins as described in FIG. 3. In some cases, the enable signal may allow the memory device to reduce power consumption by refraining from transmitting the enable signal until a pending status (e.g., ready signal) is available. In such cases, the device 435 may not issue a command (e.g., enable signal) until a status of one of the memory die 410 is available (e.g., outstanding).

In some cases, the system 400 may allow for discrete addressing of the memory die 410 by identifying the plane, block, and/or page in the indicator. In some cases, the output circuit 415 may receive a status associated with the completion of an operation (e.g., if the operation was completed, interrupted, or incomplete), thereby improving the overall performance of the memory device.

Figure 5:
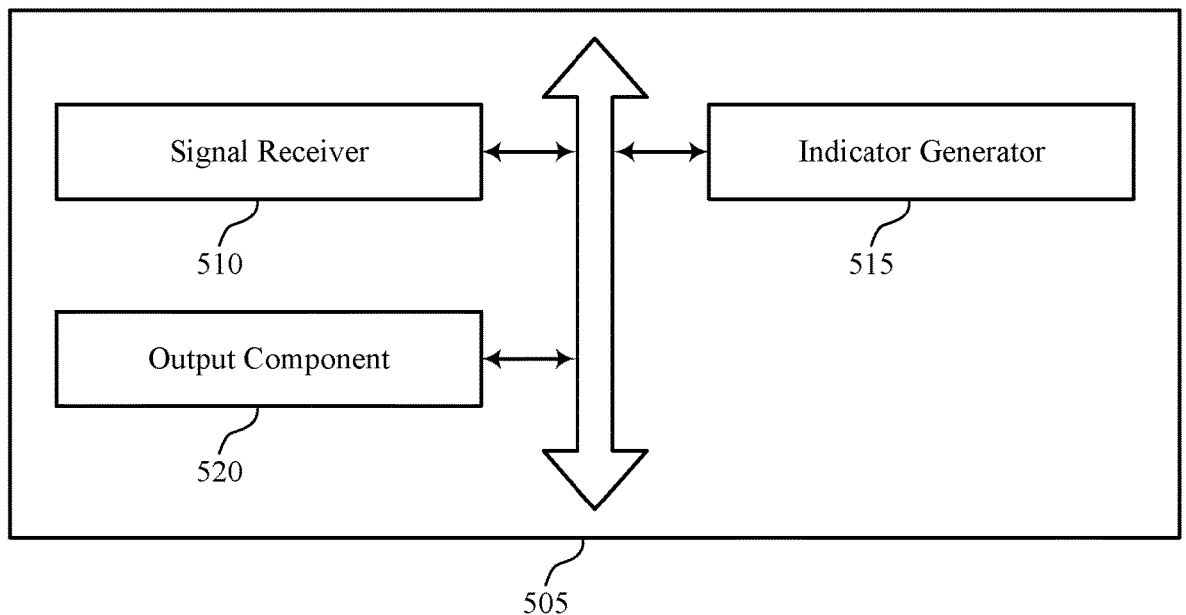
FIG. 5 shows a block diagram of a memory system that supports status check using signaling in accordance with examples as disclosed herein.

FIG. 5 shows a block diagram 500 of a memory system 505 that supports status check using signaling in accordance with examples as disclosed herein. The memory system 505 may be an example of aspects of a memory system as described with reference to FIGS. 1 through 4. The memory system 505 may include a signal receiver 510, an indicator generator 515, and an output component 520. Each of these modules may communicate, directly or indirectly, with one another (e.g., via one or more buses).

The signal receiver 510 may receive a set of ready signals from a set of memory dies, a ready signal of the set of ready signals configured to indicate whether a memory die of the set of memory dies is available to receive a command. In some examples, the signal receiver 510 may receive, from the controller, a clock signal configured to synchronize an output circuit that outputs the indicator at a clock rate, where outputting the indicator is based on receiving the clock signal.

In some examples, the signal receiver 510 may receive an enable signal configured to activate the output circuit to output the indicator, where outputting the indicator is based on receiving the enable signal. In some examples, the signal receiver 510 may store the set of ready signals associated with the set of memory dies based on receiving the set of ready signals, where generating the indicator is based on storing the set of ready signals.

The indicator generator 515 may generate an indicator of whether the memory die is available based on values of the set of ready signals.

The output component 520 may output the indicator to a controller over a first pin based on generating the indicator. In some examples, the output component 520 may output a first portion of the indicator over the first pin. In some examples, the output component 520 may output a second portion of the indicator to the controller over a second pin, where the first portion and the second portion of the indicator identify the memory die of the set of memory dies that is available.

In some examples, the output component 520 may output a first portion of the indicator over at least the first pin, the first portion of the indicator identifying of the memory die of the set of memory dies that is available. In some examples, the output component 520 may output a second portion of the indicator to the controller over a second pin, where the second portion of the indicator indicates that an output circuit is outputting the first portion of the indicator related to the set of ready signals.

Figure 6:
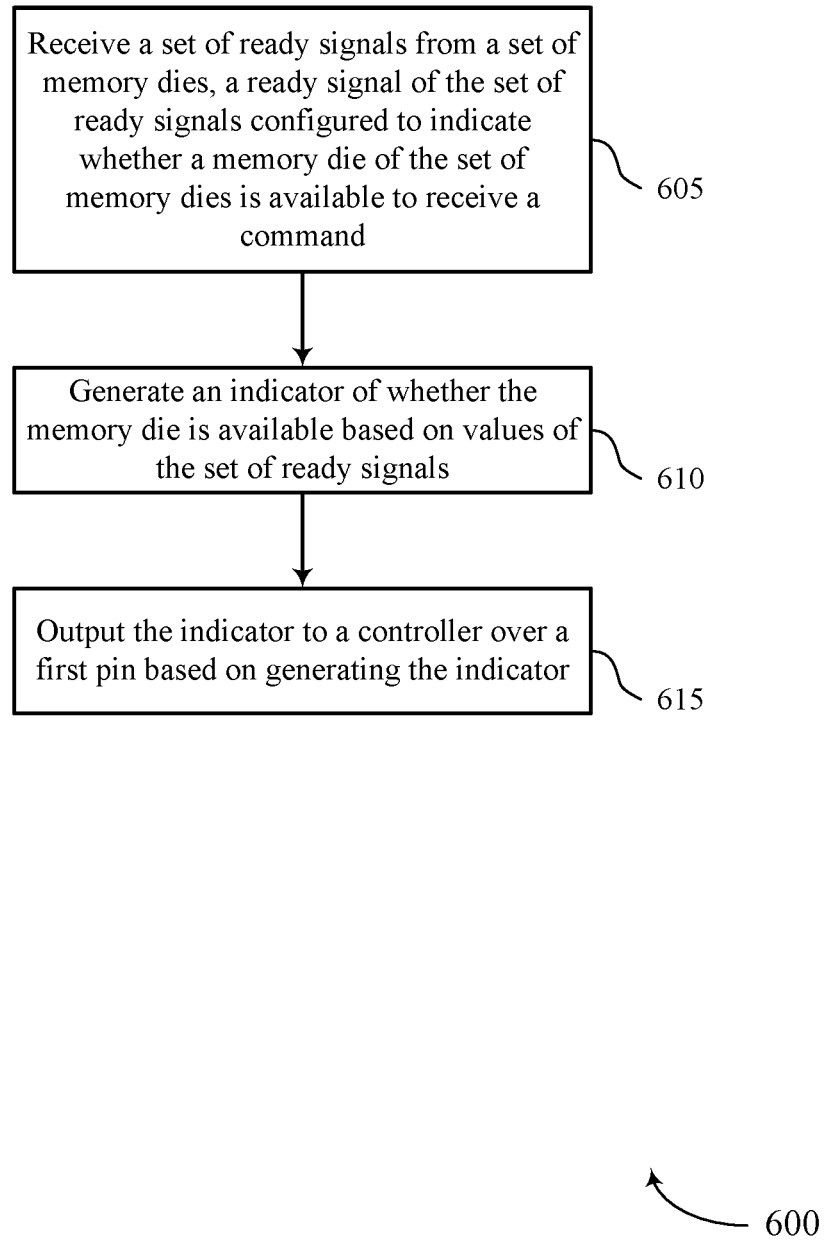
FIG. 6 shows a flowchart illustrating a method or methods that support status check using signaling in accordance with examples as disclosed herein.

FIG. 6 shows a flowchart illustrating a method or methods 600 that supports status check using signaling in accordance with examples as disclosed herein. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

Aspects of method 600 may be implemented by a controller, among other components. Additionally or alternatively, aspects of the method 600 may be implemented as instructions stored in memory (e.g., firmware stored in a memory coupled with the memory device). For example, the instructions, when executed by a controller (e.g., the memory system controller 115), may cause the controller to perform the operations of the method 600.

At 605, a set of ready signals is received. For example, the memory system may receive the set of ready signals from a set of memory dies, a ready signal of the set of ready signals configured to indicate whether a memory die of the set of memory dies is available to receive a command. The operations of 605 may be performed according to the methods described herein. In some examples, aspects of the operations of 605 may be performed by a signal receiver as described with reference to FIG. 5.

At 610, an indicator is generated. For example, the memory system may generate the indicator of whether the memory die is available based on values of the set of ready signals. The operations of 610 may be performed according to the methods described herein. In some examples, aspects of the operations of 610 may be performed by an indicator generator as described with reference to FIG. 5.

At 615, the indicator is output. For example, the memory system may output the indicator to a controller over a first pin based on generating the indicator. The operations of 615 may be performed according to the methods described herein. In some examples, aspects of the operations of 615 may be performed by an output component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving a set of ready signals from a set of memory dies, a ready signal of the set of ready signals configured to indicate whether a memory die of the set of memory dies is available to receive a command, generating an indicator of whether the memory die is available based on values of the set of ready signals, and outputting the indicator to a controller over a first pin based on generating the indicator.

In some examples of the method 600 and the apparatus described herein, outputting the indicator further may include operations, features, means, or instructions for outputting a first portion of the indicator over the first pin and outputting a second portion of the indicator to the controller over a second pin, where the first portion and the second portion of the indicator identify the memory die of the set of memory dies that may be available.

In some examples of the method 600 and the apparatus described herein, outputting the indicator further may include operations, features, means, or instructions for outputting a first portion of the indicator over at least the first pin, the first portion of the indicator identifying of the memory die of the set of memory dies that may be available and outputting a second portion of the indicator to the controller over a second pin, where the second portion of the indicator indicates that an output circuit may be outputting the first portion of the indicator related to the set of ready signals.

Some examples of the method 600 and the apparatus described herein may further include operations, features, means, or instructions for receiving, from the controller, a clock signal configured to synchronize an output circuit that outputs the indicator at a clock rate, where outputting the indicator may be based on receiving the clock signal.

Some examples of the method 600 and the apparatus described herein may further include operations, features, means, or instructions for receiving an enable signal configured to activate the output circuit to output the indicator, where outputting the indicator may be based on receiving the enable signal.

Some examples of the method 600 and the apparatus described herein may further include operations, features, means, or instructions for storing the set of ready signals associated with the set of memory dies based on receiving the set of ready signals, where generating the indicator may be based on storing the set of ready signals.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory device including a set of memory dies, each memory die of the set of memory dies configured to output a ready signal that indicates whether a memory die is available to receive a command, an output circuit coupled with each memory die of the set of memory dies and configured to receive a set of ready signals associated with the set of memory dies and generate an indicator based on values of the set of ready signals, and a first pin coupled with the output circuit and configured to output the indicator to a controller over a I/O channel.

Some examples of the apparatus may include a second pin coupled with the output circuit and configured to output a portion of the indicator to the controller over a second I/O channel, where the indicator may be configured to indicate whether the memory die may be available based on the values of the set of ready signals.

In some examples, a first portion of the indicator and a second portion of the indicator may be configured to identify the memory die of the set of memory dies that may be available. Some examples of the apparatus may include a third pin coupled with the output circuit and configured to output a second indicator to the controller that may be configured to indicate whether to read the indicator. In some examples, the second pin and the third pin include a GPIO pin.

In some examples, the output circuit includes an encoder configured to receive the set of ready signals and generate the indicator based on the set of ready signals. In some examples, the indicator may include a first portion that indicates the memory die of the set of memory dies that may be ready to receive the command, and a second portion that indicates the output circuit may be outputting information related to the set of ready signals.

In some examples, the output circuit includes a shift register configured to output the indicator to the controller for the memory die of the set of memory dies based on a clock signal. Some examples of the apparatus may include a second pin configured to receive a clock signal over a second I/O channel and synchronize the output of the indicator to the controller at a clock rate associated with the controller.

In some examples, the output circuit may be further configured to receive an enable signal and output the indicator to the controller based on receiving the enable signal.

In some examples, the indicator may be configured to indicate whether the memory die of the set of memory dies may be available based on the values of the set of ready signals. In some examples, the output circuit further include a set of latches each configured to store a value of the values of the set of ready signals associated with the set of memory dies. In some examples, the first pin includes a GPIO pin.

An apparatus is described. The apparatus may include a memory device, a control circuit coupled with the memory device and configured to cause the apparatus to, receive a plurality of ready signals from a plurality of memory dies, a ready signal of the plurality of ready signals configured to indicate whether a memory die of the plurality of memory dies is available to receive a command, generate an indicator of whether the memory die is available based on values of the set of ready signals, and output the indicator to a controller over a first pin based on generating the indicator.

Some examples may further include the control circuit configured to cause the apparatus to output a first portion of the indicator over the first pin and output a second portion of the indicator to the controller over a second pin, where the first portion and the second portion of the indicator identify the memory die of the set of memory dies that may be available.

Some examples may further include the control circuit configured to cause the apparatus to output a first portion of the indicator over at least the first pin, where the first portion of the indicator identifies the memory die of the set of memory dies that may be available and output a second portion of the indicator to the controller over a second pin, where the second portion of the indicator indicates that an output circuit may be outputting the first portion of the indicator related to the set of ready signals.

Some examples may further include the control circuit configured to cause the apparatus to receive, from the controller, a clock signal configured to synchronize an output circuit that outputs the indicator at a clock rate, where outputting the indicator may be based on receiving the clock signal.

Some examples may further include the control circuit configured to cause the apparatus to receive an enable signal configured to activate the output circuit to output the indicator, where outputting the indicator may be based on receiving the enable signal.

Some examples may further include the control circuit configured to cause the apparatus to store the set of ready signals associated with the set of memory dies based on receiving the set of ready signals, where generating the indicator may be based on storing the set of ready signals.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device comprising a plurality of memory dies, each memory die of the plurality of memory dies configured to output a ready signal that indicates whether a memory die is available to receive a command;
an output circuit coupled with each memory die of the plurality of memory dies and configured to receive a plurality of ready signals associated with the plurality of memory dies via a corresponding latch and generate an indicator corresponding to a selected memory die of the plurality of memory dies based at least in part on receiving the plurality of ready signals; and
a first pin coupled with the output circuit and configured to output the indicator to a controller over an input/output (I/O) channel.

2. The apparatus of claim 1, further comprising:
a plurality of channels for respectively coupling each memory die of the plurality of memory dies with the output circuit.

3. The apparatus of claim 1, wherein the indicator includes a bit that indicates whether a particular memory die is available to receive the command.

4. The apparatus of claim 1, wherein the output circuit communicates the indicator for one of the plurality of memory dies at every clock cycle.

5. The apparatus of claim 1, wherein the controller identifies the ready signal associated with each memory die of the plurality of memory dies based at least in part on an initialization operation for the output circuit.

6. The apparatus of claim 1, wherein the output circuit synchronizes the indicator corresponding to the selected memory die based at least in part on a clock rate associated with the controller.

7. The apparatus of claim 1, wherein the output circuit includes a shift register that receives the ready signal from each of the plurality of memory dies.

8. The apparatus of claim 7, wherein the shift register outputs the indicator for each of the plurality of memory dies in a rotating manner.

9. An apparatus, comprising:
a memory device comprising a plurality of memory dies, each memory die of the plurality of memory dies configured to output a ready signal that indicates whether a memory die is available to receive a command;
an output circuit coupled with each memory die of the plurality of memory dies and configured to receive a plurality of ready signals associated with the plurality of memory dies and generate an indicator configured to indicate whether the memory die is available based at least in part on values of the plurality of ready signals;
a plurality of first pins coupled with the output circuit and configured to output a first portion of the indicator to a controller over a first input/output (I/O) channel, wherein the plurality of memory dies comprises 2n memory dies, where n is a number of the plurality of first pins; and
a second pin coupled with the output circuit and configured to output a second portion of the indicator to the controller over a second I/O channel, wherein the second portion of the indicator is configured to indicate whether the controller may access the first portion of the indicator over the first I/O channel.

10. The apparatus of claim 1, wherein the indicator includes information indicative of one or more of a plane, block, or page associated with each of the plurality of memory dies.

11. The apparatus of claim 9, wherein the output circuit includes an encoder for receiving the plurality of ready signals and encoding the first portion of the indicator and the second portion of the indicator.

12. The apparatus of claim 9, wherein the indicator includes an address of the memory die that is available.

13. The apparatus of claim 9, wherein the first portion of the indicator includes an indication of an index or address of the memory die that is available.

14. The apparatus of claim 9, wherein the plurality of ready signals each includes a time stamp which provides an indication of an order in which the plurality of memory dies may receive the command.

15. An apparatus, comprising:
a memory device; and
a control circuit coupled with the memory device and configured to cause the apparatus to:
receive a plurality of ready signals from a plurality of memory dies, a ready signal of the plurality of ready signals configured to indicate whether a memory die of the plurality of memory dies is available to receive a command;
generate an indicator of whether the memory die is available based at least in part on values of the plurality of ready signals; and
output the indicator to a controller, wherein the indicator includes an indication of the memory die of the plurality of memory dies that is available.

16. The apparatus of claim 15, wherein the control circuit includes an encoder for receiving the plurality of ready signals and encoding the indicator.

17. The apparatus of claim 15, wherein the indicator includes an address of the memory die that is available.

18. The apparatus of claim 15, wherein the indicator includes a second indication of an index of the memory die that is available.

19. The apparatus of claim 15, wherein the plurality of ready signals each includes a time stamp that provides an order in which the plurality of memory dies may receive the command.

20. The apparatus of claim 15, wherein the control circuit is further configured to cause the apparatus to:
receive an enable signal configured to activate an output circuit to output the indicator, wherein outputting the indicator is based at least in part on receiving the enable signal.

* * * * *